United States Patent
Qu et al.

(10) Patent No.: US 8,916,953 B2
(45) Date of Patent: Dec. 23, 2014

(54) METHOD FOR MANUFACTURING SILICON SINGLE CRYSTAL WAFER AND ANNEALED WAFER

(75) Inventors: Wei Feng Qu, Annaka (JP); Fumio Tahara, Annaka (JP); Yuuki Ooi, Annaka (JP); Shu Sugisawa, Tokyo (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 13/993,810

(22) PCT Filed: Jan. 6, 2012

(86) PCT No.: PCT/JP2012/000053
§ 371 (c)(1),
(2), (4) Date: Jun. 13, 2013

(87) PCT Pub. No.: WO2012/101957
PCT Pub. Date: Aug. 2, 2012

(65) Prior Publication Data
US 2013/0264685 A1 Oct. 10, 2013

(30) Foreign Application Priority Data
Jan. 24, 2011 (JP) ................................. 2011-011790

(51) Int. Cl.
*H01L 29/32* (2006.01)
*C30B 33/02* (2006.01)
*C30B 29/06* (2006.01)

(52) U.S. Cl.
CPC ................ *C30B 33/02* (2013.01); *C30B 29/06* (2013.01); *H01L 29/32* (2013.01)
USPC .............................................. 257/617; 117/3

(58) Field of Classification Search
None
See application file for complete search history.

(56) References Cited

U.S. PATENT DOCUMENTS

| 6,191,009 B1 * | 2/2001 | Tamatsuka et al. ........... 438/471 |
| 6,413,310 B1 * | 7/2002 | Tamatsuka et al. ............... 117/3 |
| 6,843,847 B1 | 1/2005 | Iida et al. |

(Continued)

FOREIGN PATENT DOCUMENTS

| JP | 2000-20399 | * | 7/2000 | ............. C30B 33/02 |
| JP | A-2001-146498 | | 5/2001 | |

(Continued)

OTHER PUBLICATIONS

Semi M44-0305 Guide to Conversion Factors for Interstitial Oxygen in Silicon, (2005).*

(Continued)

*Primary Examiner* — Thomas L Dickey
*Assistant Examiner* — Joseph Schoenholtz
(74) *Attorney, Agent, or Firm* — Oliff PLC

(57) ABSTRACT

The present invention provides a method for manufacturing a silicon single crystal wafer, in which a heat treatment is performed with respect to a silicon single crystal wafer having oxygen concentration of less than 7 ppma and nitrogen concentration of $1\times10^{13}$ to $1\times10^{14}$ atoms/cm$^3$, which is obtained from a V-region silicon single crystal ingot grown by the Czochralski method, in a non-nitriding atmosphere at 1150 to 1300° C. for 1 to 120 minutes. As a result, a method for manufacturing a low-cost silicon single crystal wafer which is applicable to an IGBT by using a V-region wafer that is manufactured by the CZ method which can cope with an increase in diameter, by making a bulk have no defects and by providing a radial resistivity distribution, which is substantially equal to that when the neutron irradiation is effected, without performing the neutron irradiation is provided.

8 Claims, 2 Drawing Sheets

(56) References Cited

U.S. PATENT DOCUMENTS

| | | | |
|---|---|---|---|
| 7,147,711 B2 * | 12/2006 | Tamatsuka et al. | 117/13 |
| 7,344,689 B2 * | 3/2008 | Umeno et al. | 423/328.2 |
| 7,846,252 B2 * | 12/2010 | Umeno et al. | 117/13 |
| 8,617,311 B2 * | 12/2013 | Ono et al. | 117/13 |
| 2001/0029883 A1 * | 10/2001 | Minami et al. | 117/20 |
| 2004/0003769 A1 | 1/2004 | Tamatsuka et al. | |
| 2004/0192071 A1 | 9/2004 | Kobayashi et al. | |
| 2004/0231759 A1 | 11/2004 | Kobayashi et al. | |
| 2008/0102287 A1 * | 5/2008 | Umeno et al. | 428/447 |
| 2009/0000535 A1 * | 1/2009 | Ebara | 117/3 |
| 2010/0047563 A1 * | 2/2010 | Nakai et al. | 428/332 |

FOREIGN PATENT DOCUMENTS

| | | |
|---|---|---|
| JP | A-2002-100632 | 4/2002 |
| JP | A-2003-68746 | 3/2003 |
| JP | A-2003-249501 | 9/2003 |
| JP | A-2010-62466 | 3/2010 |
| WO | WO 03/003441 A1 | 1/2003 |
| WO | WO 2009/025337 | 2/2009 |
| WO | WO 2009/025338 A1 | 2/2009 |
| WO | WO 2009/025342 | 2/2009 |
| WO | WO 2009/028658 | 3/2009 |

OTHER PUBLICATIONS

Jul. 30, 2013 International Preliminary Report on Patentability issued in International Application No. PCT/JP2012/000053.

Mar. 6, 2012 International Search Report issued in International Application No. PCT/JP2012000053.

Jun. 3, 2014 Office Action issued in Japanese Patent Application No. 2011-011790 (with partial English Translation).

* cited by examiner

METHOD FOR MANUFACTURING SILICON SINGLE CRYSTAL WAFER AND ANNEALED WAFER

TECHNICAL FIELD

The present invention relates to a method for manufacturing, e.g., a silicon single crystal wafer for an IGBT.

BACKGROUND ART

As a wafer for a vertical silicon device such as an IGBT (Insulated Gate Bipolar Transistor), a wafer having an N conductivity type manufactured by an FZ method (Floating Zone Method) is generally used. Since the IGBT is a device that uses a wafer in the vertical direction, it is affected by quality of a bulk of the wafer. Therefore, the FZ method that can readily obtain a wafer having less defects is adopted.

However, increasing a diameter of the wafer by the FZ method is difficult, and this method is not suitable for mass production. Therefore, there have been suggested a nitrogen-doped wafer having a defect region that is an N region and low oxygen concentration (Patent Literature 1), and an RTA-processed wafer having an N region and low oxygen concentration (Patent Literature 2), which are manufactured by a CZ method (Czochralski Method).

It is to be noted that the defect region of the wafer in the CZ method varies in greatly dependent on a pulling rate of a silicon single crystal ingot. Grown-in defects, which can be considered as voids corresponding to agglomerations of holes that are point defects called "vacancies" are densely present in a substantially entire region in a crystal radial direction in an area where the pulling rate is high, and the region where these defects are present is called a V region. Further, when the pulling rate is reduced, an OSF ring produced in a crystal peripheral portion shrinks toward the inside of a crystal, and it is eventually annihilated. When the pulling rate is further reduced, an N (Neutral) region where excess and deficiency of the vacancies and interstitial silicon are low appears.

Since a width of the pulling rate required for obtaining an N-region silicon single crystal is narrow and a yield ratio is poor, a high-cost wafer is provided, but it has almost no defect in its crystal, and hence it is used as an IGBT wafer.

If a variation in resistivity is considerable in a wafer radial direction and in the vertical direction with respect to the IGBT wafer, a difference in resistivity is produced between devices, which can be a cause of damage.

Therefore, as the IGBT wafer, a wafer having a radial resistivity distribution which is not greater than 5% has been also suggested (Patent Literature 3, Patent Literature 4).

CITATION LIST

Patent Literatures

Patent Literature 1: WO2009/025337
Patent Literature 2: WO2009/025342
Patent Literature 3: Japanese Unexamined Patent Publication (Kokai) No. 2010-62466
Patent Literature 4: WO2009/028658

SUMMARY OF THE INVENTION

Problems to be Solved by the Invention

However, as to the above-described wafer, the N-region wafer having low oxygen concentration is subjected to nitrogen doping, RTA processing, and neutron irradiation so that defects in the bulk are eliminated and the radial resistivity distribution is improved, and use of the wafer having the N region is premised. Therefore, a cost is high, and a yield ratio is poor.

In view of the above-described problem, it is an object of the present invention to provide a method for manufacturing a low-cost silicon single crystal wafer which is applicable to an IGBT by using a V-region wafer that is manufactured by the CZ method which can cope with an increase in diameter, by making a bulk have no defects and by providing a radial resistivity distribution, which is substantially equal to that when the neutron irradiation is effected, without performing the neutron irradiation.

Means for Solving the Problems

To achieve this object, according to the present invention, there is provided a method for manufacturing a silicon single crystal wafer, wherein a heat treatment is performed with respect to a silicon single crystal wafer having oxygen concentration of less than 7 ppma (using a conversion factor of JEIDA: Japanese Electronic Industry Development Association) and nitrogen concentration of $1 \times 10^{13}$ to $1 \times 10^{14}$ atoms/cm$^3$, which is obtained from a V-region silicon single crystal ingot grown by the Czochralski method, in a non-nitriding atmosphere at 1150 to 1300° C. for 1 to 120 minutes.

According to the silicon single crystal wafer, even if the V-region silicon single crystal is used, performing the heat treatment in the non-nitriding atmosphere at 1150 to 1300° C. for 1 to 120 minutes enables effectively reducing crystal defects in not only the surface layer but also the bulk, and furthermore a radial variation in resistivity of the wafer can be also improved. Therefore, according to the manufacturing method of the present invention, the V-region silicon single crystal wafer with good productivity is used, the radial variation in resistivity is also improved without performing the neutron irradiation, and the wafer suitable for an IGBT can be manufactured, whereby productivity of the IGBT wafer can be improved and costs can be reduced.

At this time, it is preferable that a density of crystal defects having a defect size of 15 nm or more in a bulk of the silicon single crystal wafer is adjusted to $2 \times 10^6$/cm$^3$ or less by performing the heat treatment.

When such a density of crystal defects is provided, the high-quality wafer suitable for an IGBT and others can be obtained.

At this time, it is preferable that a radial variation in resistivity of the silicon single crystal wafer is adjusted to 5% or less by performing the heat treatment.

As described above, according to the method of the present invention, the radial variation in resistivity can be improved by the heat treatment without effecting the neutron irradiation, and the high-quality wafer can be obtained at low cost.

At this time, it is preferable that the silicon single crystal wafer has an N conductivity type and is used for a device for an IGBT.

According to the manufacturing method of the present invention, such a wafer for use in a device for an IGBT can be manufactured with excellent productivity at low costs.

Further, according to the present invention, there is provided an annealed wafer manufactured by performing a heat treatment with respect to a silicon single crystal wafer having oxygen concentration of less than 7 ppma and nitrogen concentration of $1 \times 10^{13}$ to $1 \times 10^{14}$ atoms/cm$^3$, which is obtained from a V-region silicon single crystal ingot grown by the Czochralski method, wherein a density of crystal defects having a defect size of 15 nm or more in a bulk of the annealed wafer is $2 \times 10^6/cm^3$ or less.

Since such an annealed wafer can be obtained from the V-region silicon single crystal ingot that can be grown with a good yield ratio, costs can be reduced. Moreover, the number of crystal defects in the bulk is small, and hence this wafer is suitable as a wafer for an IGBT.

At this time, it is preferable that a radial variation in resistivity of the annealed wafer is 5% or less.

In case of fabricating a device, such a wafer can avoid occurrence of failures, and an improved yield ratio can be obtained.

At this time, it is preferable that the annealed wafer has an N conductivity type and is used for a device for an IGBT.

In this manner, the annealed wafer according to the present invention is preferred for use in a device for an IGBT.

Effect of the Invention

As described above, according to the present invention, an annealed wafer for an IGBT can be manufactured by using the V-region silicon single crystal wafer with excellent productivity at low costs.

BEST MODE FOR CARRYING OUT THE INVENTION

Figure 1:
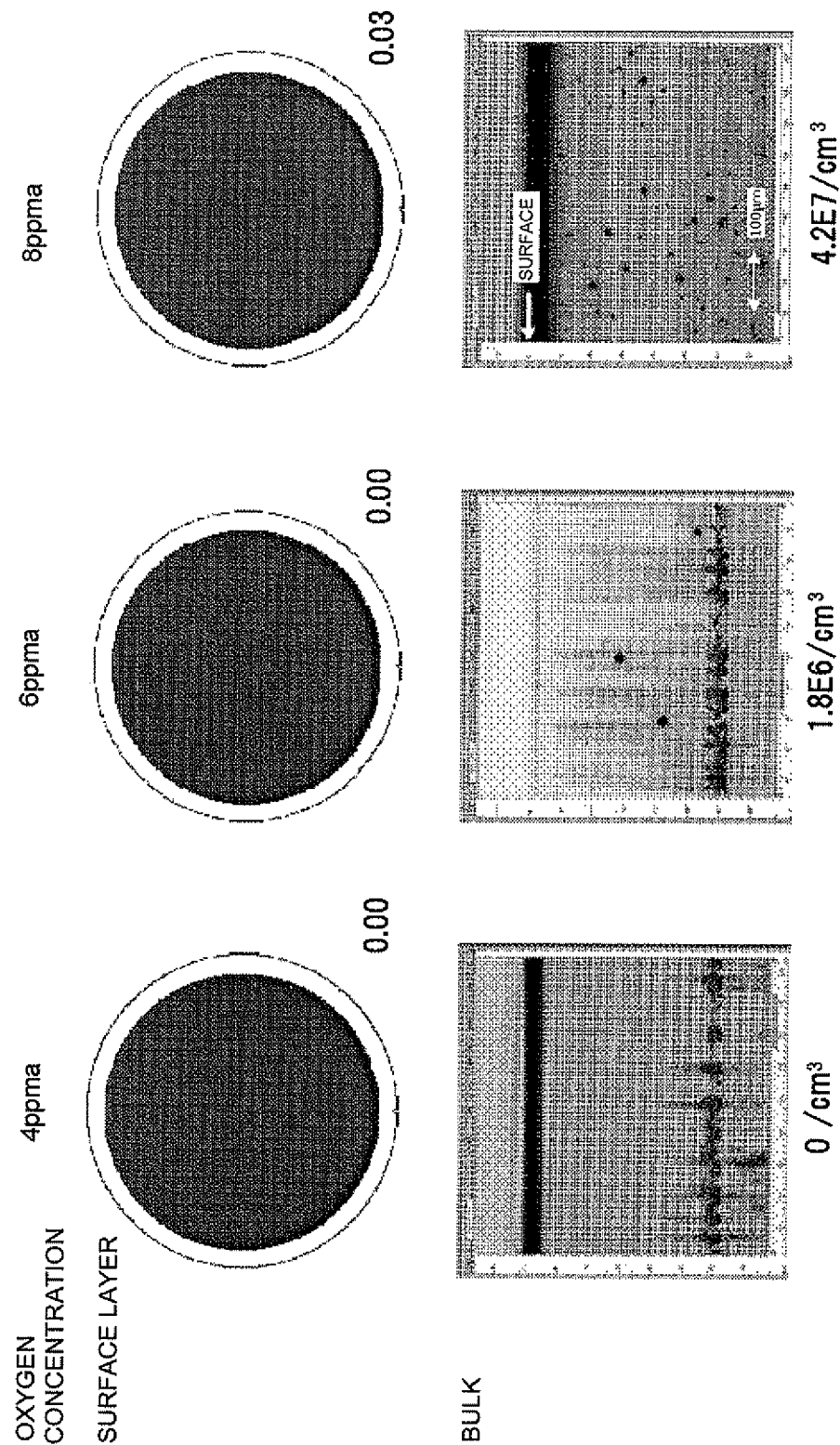
FIG. 1 is a view showing evaluation results of defects in a wafer subjected to a heat treatment according to Example 1 and Comparative Example 1.

Although an embodiment of the present invention will now be described hereinafter in detail, the present invention is not restricted thereto.

First, an annealed wafer according to the present invention is an annealed wafer manufactured by performing a heat treatment with respect to a silicon single crystal wafer having oxygen concentration of less than 7 ppma and nitrogen concentration of $1 \times 10^{13}$ to $1 \times 10^{14}$ atoms/cm$^3$, which is obtained from a V-region silicon single crystal ingot grown by the Czochralski method, and a density of crystal defects having a defect size of 15 nm or more in a bulk of the annealed wafer is $2 \times 10^6/cm^3$ or less.

According to such an annealed wafer, since the number of crystal defects whose size can lead to a problem is very small, this wafer is preferred as a wafer for an IGBT on which a device is formed along, e.g., a vertical direction (a thickness direction) of the wafer. Further, since the annealed wafer is obtained from the V-region silicon single crystal ingot, it can be manufactured with excellent productivity.

At this time, it is preferable for the radial variation in resistivity of the annealed wafer according to the present invention to be 5% or less.

Such a wafer having the homogeneity of the resistivity improved to the above-described range by the heat treatment without using the neutron irradiation can be the high-quality inexpensive wafer for an IGBT.

If the conductivity type of such an annealed wafer according to the present invention is an N type, this wafer is suitable as the wafer for use in a device for an IGBT.

As an example of a method for manufacturing the above-described annealed wafer according to the present invention, a method for manufacturing a silicon single crystal wafer according to the present invention will now be described hereinafter.

In the method for manufacturing a silicon single crystal wafer according to the present invention, a silicon single crystal wafer having oxygen concentration of less than 7 ppma and nitrogen concentration of $1 \times 10^{13}$ to $1 \times 10^{14}$ atoms/cm$^3$ obtained from a V-region silicon single crystal ingot grown by the Czochralski method is subjected to a heat treatment in a non-nitriding atmosphere at 1150 to 1300° C. for 1 to 120 minutes.

In the present invention, the silicon single crystal ingot is grown by, e.g., the MCZ method while controlling a pulling rate or the like so that a defect region becomes a V region and oxygen concentration becomes less than 7 ppma. At this time, nitrogen is doped so that nitrogen concentration can be $1 \times 10^{13}$ to $1 \times 10^{14}$ atoms/cm$^3$. Further, in case of setting the conductivity type to the N type, for example, P, As, or Sb can be doped as a dopant.

Furthermore, when the thus grown silicon single crystal ingot is sliced and subjected to, e.g., polishing, the silicon single crystal wafer whose entire surface is formed of a V region can be fabricated with the oxygen concentration of less than 7 ppma and nitrogen concentration of $1 \times 10^{13}$ to $1 \times 10^{14}$ atoms/cm$^3$.

As described above, although an N-region wafer is used for an IGBT in conventional examples, the V-region wafer can be used in the present invention, and hence a margin for the pulling rate in the ingot growth can be expanded, thereby improving productivity in wafer manufacture. Moreover, since the CZ method is used, a wafer having a large diameter can be easily obtained.

At this time, if the nitrogen concentration is less than $1 \times 10^{13}$ atoms/cm$^3$, a size of oxide precipitates in the wafer increases, and annihilating defects in a bulk by a heat treatment in a later process becomes difficult. If the nitrogen concentration is higher than $1 \times 10^{14}$ atoms/cm$^3$, an OSF region is formed on a wafer outer periphery.

Additionally, the oxygen concentration of the silicon single crystal wafer according to the present invention is less than 7 ppma or preferably 5 ppma or less, and such an extremely low oxygen concentration enables sufficiently annihilating defects in the wafer by using the heat treatment. On the other hand, if the oxygen concentration is 7 ppma or more, defects are hardly annihilated by the heat treatment, and many defects remain in the bulk in particular.

As described above, in the present invention, setting the oxygen concentration and the nitrogen concentration to fall within the above-described ranges enables reducing an oxide precipitate size in the wafer to become 250 a.u. or less when evaluated in terms of infrared scattering intensity using MO601 (manufactured by Mitsui Mining And Smelting Company, Limited), and defects can be readily annihilated by a subsequent heat treatment.

Further, such a silicon single crystal wafer is subjected to a heat treatment in a non-nitriding atmosphere of, e.g., Ar, $H_2$, or Ar+$O_2$ at 1150 to 1300° C. for 1 to 120 minutes in a vertical heat treating furnace or the like.

In this heat treatment, oxygen in a surface layer outwardly diffuses, an oxide film of an inner wall of each grown-in defect in the bulk is dissolved, each cavity is reduced, and the cavity is further filled, whereby a density of crystal defects having a defect size of 15 nm or more in the bulk can be set to $2 \times 10^6/cm^3$ or less.

At this time, when the heat treatment is carried out in a nitriding atmosphere of $NH_3$, $N_2$ or the like, a nitride film is formed on a wafer surface, the outward diffusion of the oxygen is prevented, and the defects cannot be sufficiently annihilated.

Furthermore, the annihilation of the defects is insufficient when a heat treatment temperature is less than 1150° C., and slip dislocation may occur when this temperature exceeds 1300° C. Moreover, the heat treatment temperature that is 1200° C. or less is preferred since it can assuredly avoid the occurrence of the slip dislocation. The heat treatment time that is one minute or more can effectively achieve the annihilation of the detects, and the heat treatment time that is 120 minutes or less is sufficient and can suppress the occurrence of the slip dislocation.

This heat treatment can suppress the radial variation in resistivity of the wafer to 5% or less.

In the conventional examples, to obtain such resistivity that is homogeneous in the radial direction, the neutron irradiation is required, and this treatment raises costs. However, the present inventors have discovered a method for homogenizing resistivity using a heat treatment based on the following knowledge.

A dopant such as P does not solely diffuse, but a pair of the dopant and I (Si) (interstitial silicon) diffuses. In particular, when vacancies are present, the diffusion of the dopant+I (Si) is facilitated.

Therefore, when the high-temperature heat treatment is carried out with respect to a nitrogen-doped low-oxygen wafer according to the present invention, the outward diffusion of nitrogen occurs, and excess vacancies are generated since an amount of oxygen is small. The present inventors have found out that this mass generation of vacancies facilitates the diffusion of the dopant+I (Si) and that the resistivity varies to be homogeneous.

Such a heat treatment according to the present invention enables homogenization of the resistivity which is equivalent or beyond that of the neutron irradiation and can effectively reduce manufacturing costs of a wafer for an IGBT.

According to the above-described method for manufacturing a silicon single crystal wafer of the present invention, if the conductivity is set to the N type, a wafer which is preferred for use in a device for an IGBT can be manufactured with excellent productivity at low cost.

However, the annealed wafer and a wafer manufactured by the method for manufacturing a silicon single crystal wafer according to the present invention can be also used for devices other than the IGBT.

EXAMPLES

The present invention will now be more specifically explained based on examples and comparative examples, but the present invention is not restricted thereto.

Example 1, Comparative Example 1

Verification of Critical Significance of Oxygen Concentration

Three types of V-region silicon single crystal wafers having nitrogen concentration of $5\times10^{13}$ atoms/cm³ and oxygen concentrations of 4 ppma, 6 ppma, and 8 ppma (JEIDA) obtained by the Czochralski method were prepared, and a heat treatment was performed in an Ar atmosphere at 1170° C. for one hour.

A density of crystal defects having a size of 15 nm or more in each wafer subjected to this heat treatment was evaluated by using MO601 (manufactured by Mitsui Mining And Smelting Company, Limited). MO601 enables the evaluation of defects present at 5 μm or so in a surface layer.

At the time of the evaluation, the defect evaluation in a bulk was carried out by polishing in a depth direction (aiming for 50 μm or 100 μm) and using MO601. According to this evaluation method, an overall polished surface can be evaluated.

FIG. 1 and Table 1 show an evaluation result.

TABLE 1

|  |  | Oxygen concentration Oi (ppma) | | | |
| --- | --- | --- | --- | --- | --- |
|  |  | 4 | 5 | 6 | 8 |
| Surface layer (/cm²) |  | 0.00 | 0.00 | 0.00 | 0.03 |
| Bulk (/cm³) | 50 μm polishing | 0 | 0 | 1.8E6 | 4.2E7 |
|  | 100 μm polishing | 0 | 0 | 1.8E6 | 4.2E7 |

As shown in FIG. 1 and Table 1, when the oxygen concentration is 8 ppma, defects remained in the bulk in particular even though the heat treatment was carried out, and it was impossible to adjust the defect density in the bulk to $2\times10^6/cm^3$ or less. On the other hand, in case of 4 to 6 ppma, the defect density was $2\times10^6/cm^3$ or less, and defects were not detected in the bulk in case of 5 ppma or less in particular. Therefore, it can be understood that the oxygen concentration of less than 7 ppma, especially 5 ppma or less, is preferable.

Example 2, Comparative Example 2

Verification of Critical Significance of Nitrogen Concentration

Four types of V-region silicon single crystal wafers having oxygen concentration of 4 ppma (JEIDA) and nitrogen concentration of less than $1\times10^{13}$ atoms/cm³, $2\times10^{13}$ atoms/cm³, $5\times10^{13}$ atoms/cm³, $2\times10^{14}$ atoms/cm³ obtained by the Czochralski method were prepared, and a heat treatment was performed in an Ar atmosphere at 1170° C. for one hour.

Table 2 shows a result obtained by evaluating defects by the same method as Example 1 and Comparative Example 1.

TABLE 2

|  |  | $N_2$ (atoms/cm³) | | | |
| --- | --- | --- | --- | --- | --- |
|  |  | <1E13 | 2E13 | 5E13 | 2E14 |
| Surface layer (/cm²) |  | 36.6 | 0.000 | 0.004 | 0.001 |
| Bulk (/cm³) | 50 μm polishing | 4E6 | 0.00 | 0.00 | 0.00 |
|  | 100 μm polishing | 4E6 | 0.00 | 0.00 | 0.00 |

As obvious from Table 2, when the nitrogen concentration is less than $1\times10^{13}$ atoms/cm³, a size of defects in the central portion is large, and the defects remain in the surface layer and the bulk even after the heat treatment.

Figure 2:
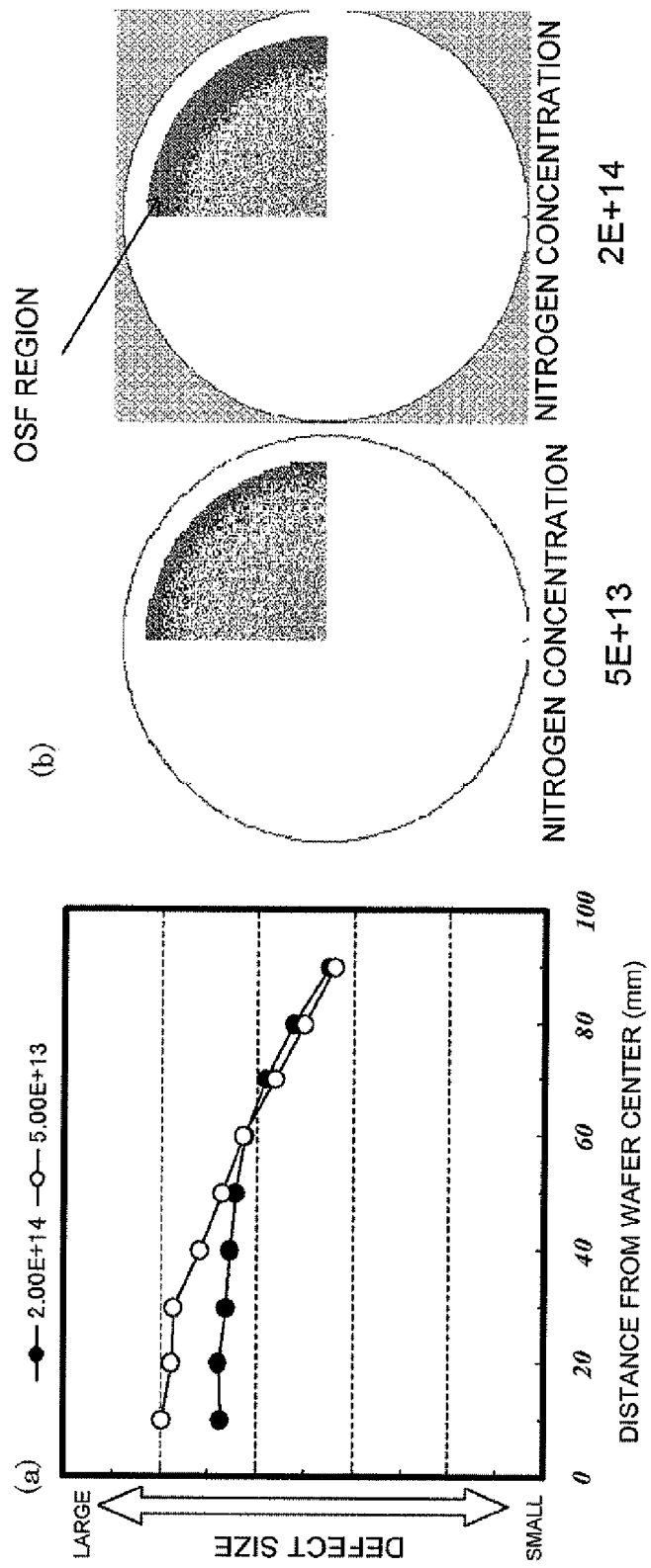
FIG. 2(a) is a graph showing a size of defects in a wafer radial direction, and (b) is a view showing a defect region based on nitrogen concentration.

FIG. 2(a) is a graph showing a size of defects in the silicon single crystal before the heat treatment, and (b) shows a result obtained by measuring a defect region on the surface by using MO601. The defect size in the central portion decreases as the nitrogen concentration increases as shown in FIG. 2(a). However, as shown in FIG. 2(b), when the nitrogen concentration is $2 \times 10^{14}$ atoms/cm² even though the wafer is obtained from the single crystal pulled under the same conditions, the nitrogen concentration is excessive, and an OSF region is formed at the outer periphery of the V region. When the nitrogen concentration exceeded $1 \times 10^{14}$ atoms/cm³ in this manner, the OSF region was formed at the outer periphery.

Example 3, Comparative Example 3

V-region silicon single crystal wafers having nitrogen concentration of $5 \times 10^{13}$ atoms/cm³ and oxygen concentration of 4 ppma (JEIDA) obtained by the Czochralski method were prepared, and a heat treatment was performed in an Ar atmosphere for one hour. The heat treatment was performed at each of heat treatment temperatures of 1130, 1150, 1170, 1200, and a temperature higher than 1300° C. (>1300° C.).

Defects were evaluated by the same method as Example 1 and Comparative Example 1. Furthermore, a radial resistivity distribution on a surface was measured by Spreading Resistance method. Table 3 shows a result.

TABLE 3

| | Heat treatment temperature (° C.) | | | | |
|---|---|---|---|---|---|
| | 1130 | 1150 | 1170 | 1200 | >1300 |
| Surface layer defect (/cm³) | 1.5 | 0.008 | 0.001 | 0.00 | 0.004 |
| Defects in bulk (/cm³) | 5E6 | 0 | 0 | 0 | 0 |
| Slip dislocation | None | None | None | None | Present |
| Radial resistivity distribution (%) | <7 | <5 | <5 | <5 | <5 |

As shown in Table 3, when the heat treatment temperature is 1130° C., defects remain, and homogenization of resistivity is insufficient. On the other hand, when the heat treatment temperature is 1150 to 1200° C., the defects are annihilated, and the resistivity is homogeneous. Additionally, when the heat treatment temperature is higher than 1300° C., the slip dislocation occurs.

It is to be noted that the present invention is not restricted to the foregoing embodiment. The embodiment is just an illustrative example, and any examples which have substantially the same configuration and exercise the same functions and effects as the technical concept described in claims according to the present invention are included in the technical scope of the invention.

The invention claimed is:

1. A method for manufacturing a silicon single crystal wafer, wherein
a heat treatment is performed with respect to a silicon single crystal wafer having oxygen concentration of less than 7 ppma and nitrogen concentration of $1 \times 10^{13}$ to $1 \times 10^{14}$ atoms/cm³, which is obtained from a V-region silicon single crystal ingot grown by the Czochralski method, in a non-nitriding atmosphere at 1150 to 1300° C. for 1 to 120 minutes, and
a density of crystal defects having a defect size of 15 nm or more in a bulk of the silicon single crystal wafer is adjusted to $2 \times 10^6$/cm³ or less by performing the heat treatment.

2. The method for manufacturing a silicon single crystal wafer according to claim 1,
wherein a radial variation in resistivity of the silicon single crystal wafer is adjusted to 5% or less by performing the heat treatment.

3. The method for manufacturing a silicon single crystal wafer according to claim 1,
wherein the silicon single crystal wafer has an N conductivity type and is used for a device for an IGBT.

4. The method for manufacturing a silicon single crystal wafer according to claim 2,
wherein the silicon single crystal wafer has an N conductivity type and is used for a device for an IGBT.

5. An annealed wafer manufactured by performing a heat treatment with respect to a silicon single crystal wafer having oxygen concentration of less than 7 ppma and nitrogen concentration of $1 \times 10^{13}$ to $1 \times 10^{14}$ atoms/cm³, which is obtained from a V-region silicon single crystal ingot grown by the Czochralski method,
wherein a density of crystal defects having a defect size of 15 nm or more in a bulk of the annealed wafer is $2 \times 10^6$/cm³ or less.

6. The annealed wafer according to claim 5,
wherein a radial variation in resistivity of the annealed wafer is 5% or less.

7. The annealed wafer according to claim 5,
wherein the annealed wafer has an N conductivity type and is used for a device for an IGBT.

8. The annealed wafer according to claim 6,
wherein the annealed wafer has an N conductivity type and is used for a device for an IGBT.

* * * * *